United States Patent
Ide et al.

(10) Patent No.: US 9,305,827 B2
(45) Date of Patent: Apr. 5, 2016

(54) HANDLE SUBSTRATES OF COMPOSITE SUBSTRATES FOR SEMICONDUCTORS

(71) Applicant: NGK INSULATORS, LTD., Aichi (JP)

(72) Inventors: Akiyoshi Ide, Kasugai (JP); Yasunori Iwasaki, Kitanagoya (JP); Sugio Miyazawa, Kasugai (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/578,916

(22) Filed: Dec. 22, 2014

(65) Prior Publication Data

US 2015/0132540 A1    May 14, 2015

Related U.S. Application Data

(63) Continuation of application No. PCT/JP2014/059696, filed on Mar. 26, 2014.

(30) Foreign Application Priority Data

Mar. 27, 2013  (JP) ................. 2013-066951

(51) Int. Cl.
   - *H01L 21/00* (2006.01)
   - *H01L 21/762* (2006.01)
   - *B23K 20/00* (2006.01)
   - *H01L 21/20* (2006.01)
   - *H01L 21/02* (2006.01)

(52) U.S. Cl.
   CPC .......... *H01L 21/76251* (2013.01); *B23K 20/00* (2013.01); *H01L 21/2007* (2013.01); *H01L 21/02002* (2013.01); *H01L 21/0243* (2013.01); *H01L 21/76254* (2013.01); *Y10T 428/24355* (2015.01)

(58) Field of Classification Search
   CPC ............ H01L 21/76251; H01L 21/02002; H01L 21/0243; H01L 21/76254
   See application file for complete search history.

(56) References Cited

U.S. PATENT DOCUMENTS

| 6,090,648 A | 7/2000 | Reedy et al. |
| 6,908,828 B2 | 6/2005 | Letertre et al. |

(Continued)

FOREIGN PATENT DOCUMENTS

| JP | 5-160240 A | 6/1993 |
| JP | 8-512432 A | 12/1996 |
| JP | 2003-224042 A | 8/2003 |

(Continued)

OTHER PUBLICATIONS

Office Action for Japanese Patent App. No. 2014-545018 (Mar. 6, 2015).

(Continued)

*Primary Examiner* — Nicholas Tobergte
(74) *Attorney, Agent, or Firm* — Cermak Nakajima & McGowan LLP; Tomoko Nakajima

(57) ABSTRACT

A composite substrate for a semiconductor includes a handle substrate 11 and a donor substrate bonded to a surface of the handle substrate 11 directly or through a bonding layer. The handle substrate 11 is composed of an insulating polycrystalline material, a surface 15 of the handle substrate 11 has a microscopic central line average surface roughness Ra of 5 nm or smaller, and recesses 6 are formed on the surface of the handle substrate.

8 Claims, 7 Drawing Sheets

(56) References Cited

U.S. PATENT DOCUMENTS

| | | |
|---|---|---|
| 2008/0261381 A1 | 10/2008 | Akiyama et al. |
| 2012/0119336 A1 | 5/2012 | Akiyama |

FOREIGN PATENT DOCUMENTS

| | | |
|---|---|---|
| JP | 2008-288556 A | 11/2008 |
| JP | 2010-232625 A | 10/2010 |
| JP | 2010-278341 A | 12/2010 |
| JP | 2012-109399 A | 6/2012 |
| JP | 2014-154687 A | 8/2014 |
| WO | WO2010/128666 A1 | 11/2010 |

OTHER PUBLICATIONS

International Search Report for PCT Patent App. No. PCT/JP2014/059696 (Jul. 1, 2014).

Written Opinion for PCT Patent App. No. PCT/JP2014/059696 (Jul. 1, 2014).

Office Action from Chinese Patent App. No. 201480001476.5 (Oct. 10, 2015).

English language International Preliminary Report on Patentability for PCT Patent App. No. PCT/JP2014/059696 (Oct. 8, 2015).

Surface recess

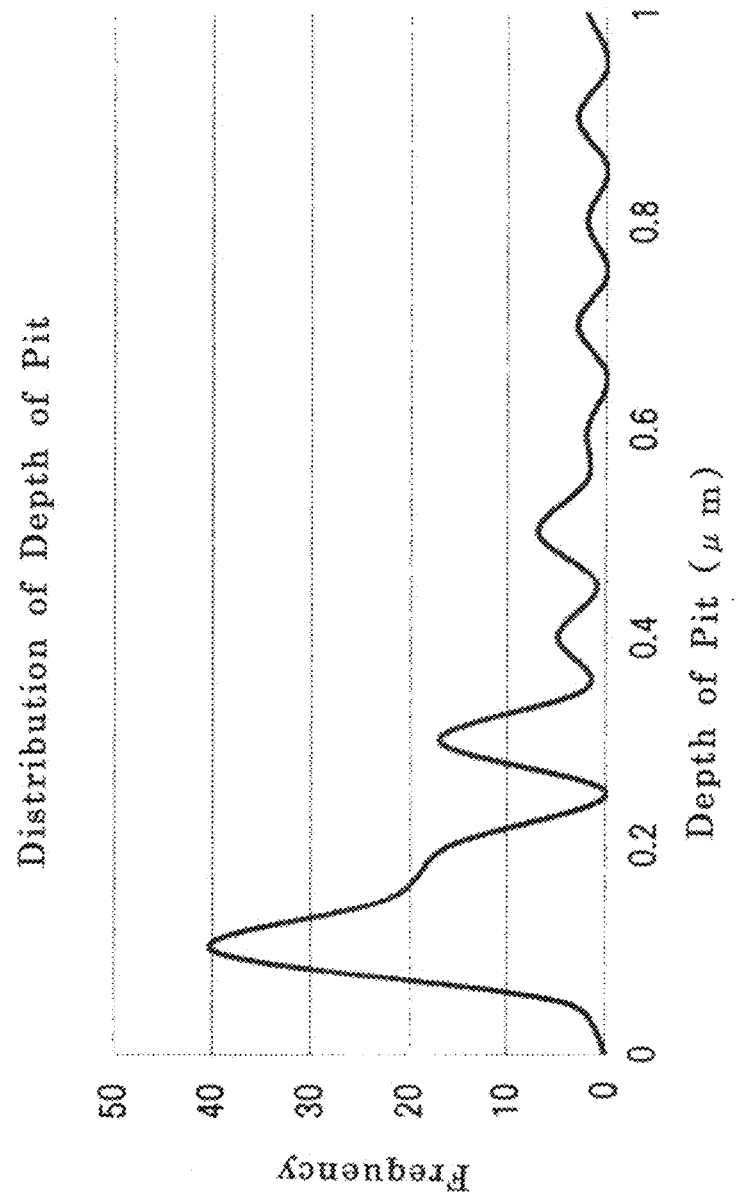

HANDLE SUBSTRATES OF COMPOSITE SUBSTRATES FOR SEMICONDUCTORS

FIELD OF THE INVENTION

The present invention relates to a handle substrate of a composite substrate for a semiconductor.

According to prior arts, it has been known to obtain SOI including a handle substrate composed of a transparent and insulating substrate and called Silicon on Quartz (SOQ), Silicon on Glass (SOG) and Silicon .on Sapphire (SOS), and adhered wafer by bonding a transparent wide-gap semiconductor including GaN, ZnO, diamond, AlN or the like to a donor substrate such as silicon. SOQ, SOG, SOS and the like are expected for applications such as a projector and high frequency device due to the insulating property and transparency of the handle substrate. Further, the composite wafer, which is obtained by adhering a thin film of the wide-gap semiconductor to the handle substrate, is expected in applications such as a high performance laser and power device.

Such composite substrate for semiconductor integrated circuit is composed of the handle substrate and donor substrate, and the handle and donor substrates are generally made of single crystal materials. According to prior arts, it was generally performed a method of forming a silicon layer on a base substrate by epitaxial growth. It has recently developed a method of directly bonding them to contribute to the improvement of performance of a semiconductor device (Patent documents 1, 2 and 3). That is, such handle and donor substrates are bonded through a bonding layer or an adhesive layer or directly bonded with each other. Further, as the development of the bonding technique, it has been proposed various kinds of handle substrates made of materials, other than sapphire, such as quartz, glass and alumina (Patent documents 4, 5, 6 and 7).

PRIOR DOCUMENTS (Patent document 1) Japanese Patent Publication No. H08-512432A
(Patent document 2) Japanese Patent Publication No. 2003-224042A
(Patent document 3) Japanese Patent Publication No. 2010-278341A
(Patent document 4) WO 2010/128666 A1
(Patent document 5) Japanese Patent Publication No. H05-160240A
(Patent document 6) Japanese Patent Publication No. H05-160240A
(Patent document 7) Japanese Patent Publication No. 2008-288556A

SUMMARY OF THE INVENTION

As to the handle substrate used for the bonding with the donor substrate, it is desirable to subject it to high-precision polishing by CMP or the like to make its Ra value not higher than 5 nm, for maximizing the bonding force due to intermolecular force. However, the thus produced composite substrate is sometimes subjected to atmosphere at a temperature near 1000° C. during various kinds of semiconductor processes. Therefore, in the case that materials of functional layer are different from those of the supporting substrate and bonding layer, it may occur the problem of peeling of the substrate due to a difference of thermal expansion of the respective materials. It is thus desired to make the Ra value of the handle substrate surface low for maximizing the bonding force due to intermolecular force and, at the same time, to endure thermal stress due to the high temperature processes after the bonding.

An object of the present invention is to provide a handle substrate of a composite substrate for a semiconductor, in which the handle substrate can be bonded with a donor substrate and its resistance against thermal stress during high temperature process after the bonding can be improved.

The present invention provide a handle substrate of a composite substrate for a semiconductor; said handle comprising an insulating polycrystalline material, wherein said handle substrate has a surface having a microscopic central line average surface roughness Ra of 5 nm or smaller and wherein recesses are formed on the surface.

The present invention further provides a composite substrate for a semiconductor, wherein the composite substrate includes the handle substrate and a donor substrate bonded with the surface of the handle substrate directly or through a bonding layer.

In the case that the handle substrate is composed of a sapphire substrate, it is possible to make a surface of the handle substrate extremely smooth. However, after the composite substrate after the bonding is subjected to high temperature process, cracks or peeling tends to occur due to a difference of thermal expansion between the handle and donor substrates.

Thus, the inventors have formed the handle substrate from a polycrystalline material. Here, such polycrystalline material has microstructure in which many fine particles are bonded together. After the polycrystalline material is shaped as such, the inventors tried to subject the surface to high-precision polishing appropriately to sufficiently lower Ra and, at the same time, to cause falling-off of fine crystal grains between adjacent crystal grains on the surface or to actively utilize bubbles present inside of the crystal to obtain a structure with fine recesses being left.

As described above, it was possible to bond it with the donor substrate by making the surfaces of the crystal grains smooth microscopically. Simultaneously, by forming the microstructure, in which the fine recesses are left between the adjacent crystal grains, on the surface of the handle substrate, the bonding layer or adhesive are filled in the recesses, so that strong anchor effect can be expected. It is thus possible to prevent the cracks or peeling due to the difference of thermal expansion.

BRIEF DESCRIPTION OF THE DRAWINGS

FIG. 6 is a graph showing distribution of depths of recesses formed on a surface of a handle substrate.

EMBODIMENTS FOR CARRYING OUT THE INVENTION

Figure 1A:
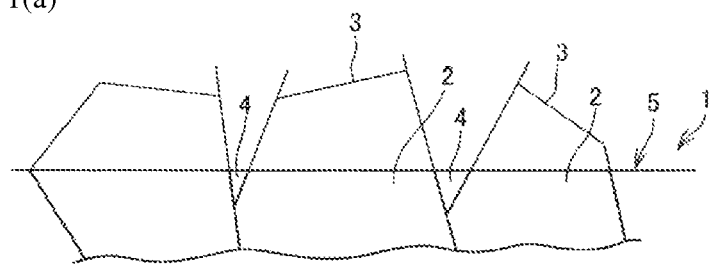
FIG. 1(*a*) is a diagram showing process steps of a polycrystalline material, and FIG. 1(*b*) is a view schematically showing state of a surface of a handle substrate according to the present invention.

The present invention will be described further, referring to the drawings appropriately.

Figure 3A:
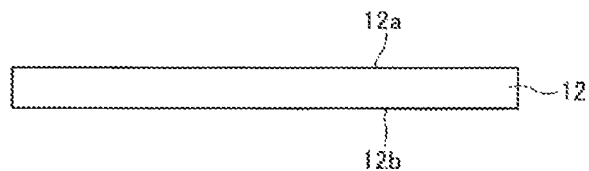
FIG. 3(*a*) shows a blank substrate 12 made of a polycrystalline material, FIG. 3(*b*) shows a substrate material 1 obtained by subjecting the blank substrate 12 to high-precision polishing, FIG. 3(*c*) shows a handle substrate 11 obtained by further polishing the substrate material 1, FIG. 3(*d*) shows a composite substrate 20A obtained by bonding the handle substrate 11 with a donor substrate 17 provided thereon through a bonding layer 16, and FIG. 3(*e*) shows a composite substrate 20B obtained by directly bonding the handle substrate 11 with the donor substrate 17 provided thereon.
Figure 3B:
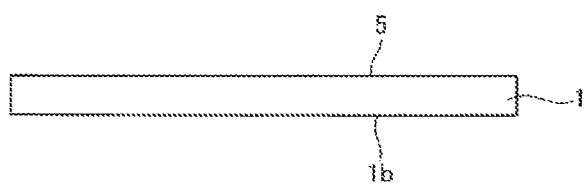

First, as shown in FIG. 3(a), it is prepared a blank substrate 12 made of a polycrystalline material. A surface 12a and bottom face 12b of the blank substrate 12 may be a ground surface or a sintered surface (as-fired surface).

The polycrystalline material has microstructure in which many fine grains are bonded together. As shown in FIG. 1(a), the polycrystalline material is constituted by crystal grains 3 randomly distributed. The surface 12a of the blank substrate 12 is subjected to high-precision polishing so that each crystal grain 3 is polished along a plane and the polished crystal grains 2, each having a flat surface, are exposed to the surface. The surfaces of the polished crystal grains 2 become smooth.

Figure 3C:
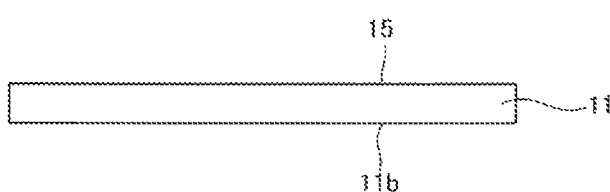

Here, recesses are left between the crystal grains 2 left on the surface 5 of the material 1. At this time, fine grains 4, in which most of them is already removed by the polishing, are left in the recesses. The surface 5 of the substrate 1 is then subjected to additional high-precision polishing to further improve the central line average surface roughness Ra of the exposed surface of the crystal grain 2. At this time, it was successfully removed the fine grains 4 left in the grain boundaries to leave recesses 6 (FIG. 1(b) and FIG. 3(c)). As the grains 4 are small and the adhesive force with other crystal grains is low, edge portions of the respective crystal grains left on the surface 5 of the material 1 can be easily removed by the additional polishing. It is thus possible to form many recesses on the surface without performing a process such as patterning. Further, it is possible to facilitate the generation of bubbles inside of the crystal so that the recesses are formed on the surface after the polishing, by making the crystal grain size of the material 15 µm or larger.

That is, in the case that the recesses are formed by the removal of the remaining crystal grains, it is possible to form the recesses on the grain boundaries of the crystal grains. Further, in the case that the recesses are derived from the bubbles provided by control of the crystal grain size, as the bubbles are present inside of the crystal grains, it is possible to form the recess inside of each crystal grain on the surface after the polishing.

According to the thus obtained handle substrate 11, the microscopic central line average surface roughness Ra of the surface 15 is 5 nm or smaller, and the recesses 6 due to the removal of the crystal grains 4 from the surface of the handle substrate are formed along the grain boundaries of the adjacent crystal grains 2.

Figure 1B:
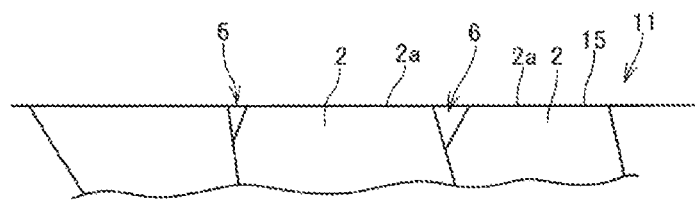
Figure 2:
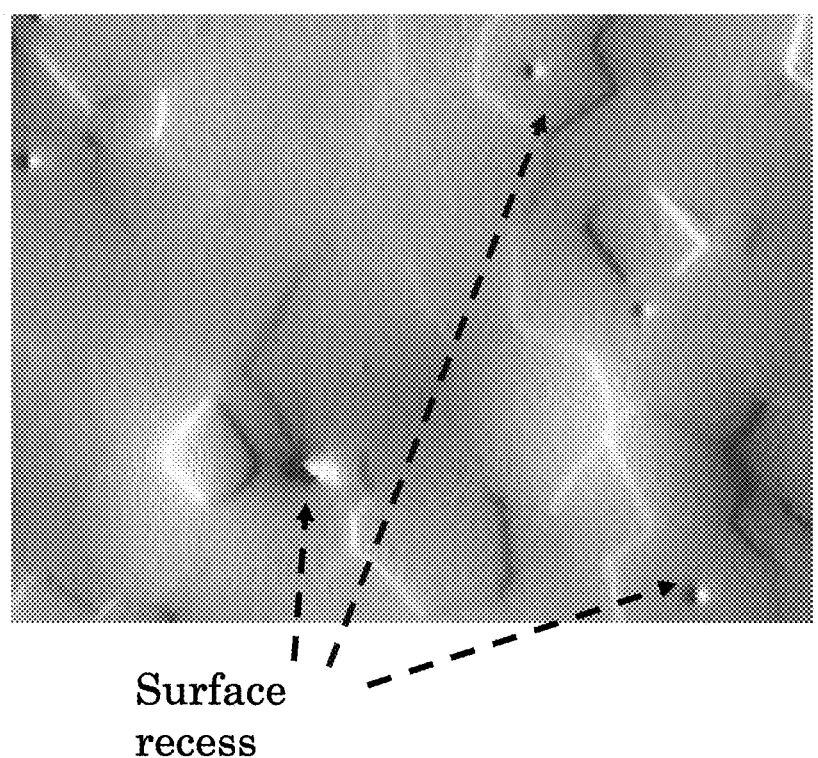
FIG. 2 is a photograph showing a surface of a handle substrate according to the present invention.

FIG. 2 is a photograph showing the surface shown in the schematic view of FIG. 1(b). In the photograph shown in FIG. 2, dark portions correspond to the exposed faces 2a of the grains 2, bright and elongate lines correspond to the grain boundaries and round recesses correspond to the recesses 6.

Figure 3D:
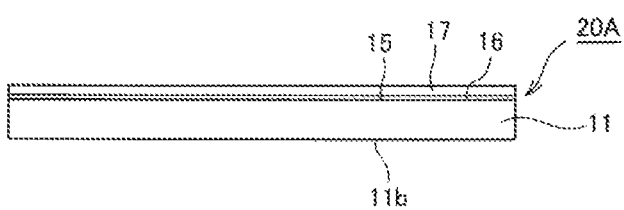
Figure 4A:
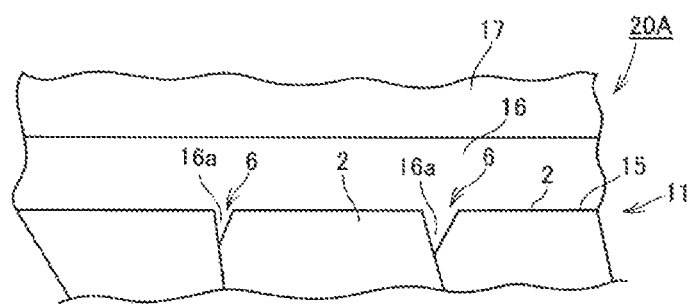
FIG. 4(*a*) is a view schematically showing microstructure of the composite substrate 20A obtained by bonding the handle substrate 11 with the donor substrate 17 provided thereon through the bonding layer 16.
FIG. 4(b) is a view schematically showing microstructure of the composite substrate 20B obtained by directly bonding the handle substrate 11 with the donor substrate 17 provided thereon.

After the handle substrate 11 is obtained, the donor substrate 17 can be bonded to the surface 15 of the handle substrate 11. According to the example of FIGS. 3(d) and 4(a), the donor substrate 17 is bonded with the surface 15 of the handle substrate 11 through the bonding layer 16. In this case, as the surface of the handle substrate 11 is flat in microscopic view, it is possible to improve the bonding strength with the donor substrate. Further, as a material forming the bonding layer 16 is included into the recesses 6 as 16a to exhibit a kind of anchor effect, it is proved that the peeling of the donor substrate from the handle substrate due to the difference of thermal expansion can be prevented.

Figure 3E:
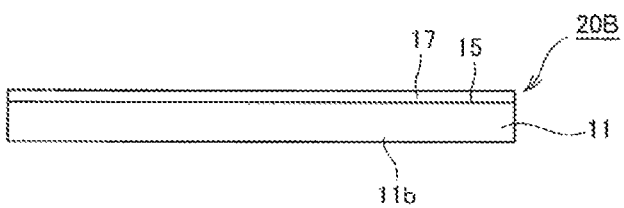
Figure 4B:
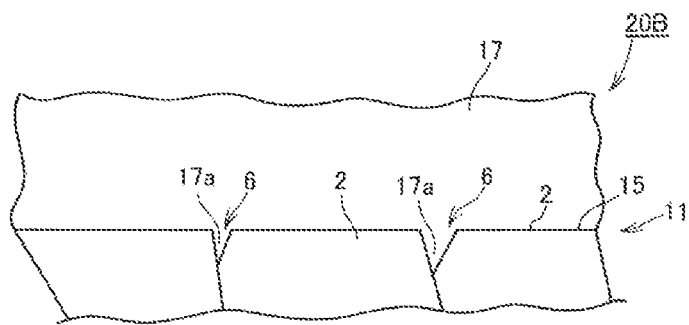

Further, according to the example shown in FIGS. 3(e) and 4(b), the donor substrate 17 is directly bonded to the surface 15 of the handle substrate 11. In this case, as the surface of the handle substrate 11 is flat in microscopic view, it is possible to improve the bonding strength with the donor substrate. Further, as a material forming the donor substrate is included into the recesses 6 as 17a to exhibit a kind of anchor effect, it is proved that the peeling of the donor substrate from the handle substrate due to the difference of thermal expansion can be prevented.

Elements of the present invention will be described further below.

(Composite Substrate for Semiconductor)

The composite substrate of the present invention can be utilized for a semiconductor, especially semiconductor circuit board, for a projector, high frequency device, high performance laser, power device or the like.

The composite substrate includes the inventive handle substrate and a donor substrate.

Materials of the donor substrates are not particularly limited, and may preferably be selected from the group consisting of silicon, aluminum nitride, gallium nitride, zinc oxide and diamond. The thickness of the donor substrate is not particularly limited, and may be near that of conventional SEMI/JEIDA standard on the viewpoint of handling.

The donor substrate may include the above described material whose surface may include an oxide film. It is because the effect of preventing channeling of implanted ions by performing ion implantation through the oxide film. The oxide film preferably has a thickness of 60 to 500 nm. Such donor substrate including the oxide film is also categorized as the donor substrate, and it is called donor substrate unless specifically indicated.

(Handle Substrate)

The thickness of the handle substrate is not particularly limited, and may be near that of conventional SEMI/JEIDA standard on the viewpoint of handling.

The material of the handle substrate is a polycrystalline material. The polycrystalline material is not particularly limited, and may preferably be selected from the group consisting of silicon oxide, aluminum oxide, aluminum nitride, silicon carbide, silicon nitride, sialon and gallium nitride.

The crystal grain size of the polycrystalline material may preferably be 5 µm or larger, so that it is possible to facilitate the control of the removal phenomenon of the crystal grains. In the case that the size of the crystal grains is too small, the removal of the grains becomes considerable and a number of the recesses becomes large, so that it tends to affect the characteristics of a semiconductor formed later thereon. On the viewpoint, the size of the crystal grains of the polycrystalline material may preferably be 15 µm or larger.

Further, the size of the crystal grain of the polycrystalline material may preferably be 200 µm or smaller. It is thereby possible to prevent that the diameter of the recess becomes too large.

Further, the relative density of the polycrystalline material forming the handle substrate may preferably be 98 percent or larger and more preferably be 99 percent or larger, on the viewpoint of endurance against the subsequent process of a semiconductor and prevention of contamination of it.

(Translucent Alumina Ceramics)

As the polycrystalline material, translucent alumina ceramics may most preferably be used. As the reason, an extremely dense sintered body can be obtained, so that fracture and cracks of the handle substrate are hardly generated even when stress is concentrated on the recess-formed portions.

Methods of molding the translucent alumina substrate is not particularly limited, and may be an optional process such as doctor blade, extrusion, gel casting or the like. Most preferably, the substrate is produced utilizing gel casting. According to a preferred embodiment, slurry containing ceramic powder, dispersing agent and gelling agent is cast into a mold, the slurry is then gelled to obtain a molded body, and the molded body is sintered.

Most preferably, it is used raw material composed of high-purity alumina powder having a purity of 99.9 Percent or higher (preferably 99.95 percent or higher) and 150 to 1000 ppm of an aid added to the powder. Such high-purity alumina powder includes high-purity alumina powder produced by Taimei Chemical Industries Corporation.

As the aid described above, although magnesium oxide is preferred, $ZrO_2$, $Y_2O_3$, $La_2O_3$ and $Sc_2O_3$ are exemplified.

According to a preferred embodiment, an amount of an impurity, other than alumina, contained in the translucent alumina substrate is 0.2 mass percent or smaller, so that it is possible to prevent the contamination of a semiconductor. The present invention is thus particularly useful.

The average particle size (primary particle size) of the raw material is not particularly limited, and may preferably be 0.5 µm or smaller and more preferably be 0.4 µm or smaller, on the viewpoint of densification by the sintering at a low temperature. More preferably, the average particle size of the powdery raw material is 0.3 µm or smaller. The lower limit of the average particle diameter is not particularly limited. The average particle diameter of the powdery raw material can be decided by direct observation of the powdery raw material using SEM (Scanning type electron microscope).

Besides, the average particle size means an average value of n=500 values of (length of the longest axis+length of the shortest axis)/2 of primary particles, excluding secondary aggregated particles, on optical two visual fields at a magnitude of ×30000 of SEM photograph.

The gel cast molding includes the following methods.

(1) Inorganic powder, prepolymer as a gelling agent such as polyvinyl alcohol, epoxy resin, phenol resin or the like and a dispersing agent are dispersed in dispersing medium to produce slurry, which is cast into a mold and then cross-linked three-dimensionally using a cross-linking agent to perform the gelation, so that the slurry is solidified.

(2) An organic dispersing medium having a reactive functional group and gelling agent are chemically bonded to each other to solidify the slurry.

(Microstructure of Surface of Handle Substrate)

According to the present invention, the central line average surface roughness Ra of the surface of the handle substrate in microscopic view is 5 nm or smaller. If it is too large, the bonding strength to the donor substrate is reduced due to intermolecular force. It may preferably be 3 nm or smaller and more preferably be 1 nm or smaller, on the viewpoint of the present invention. Besides, it is a value obtained by taking an image of the exposed face 2a of each crystal grain 2 (refer to FIG. 1(b)) exposed to the surface by means of an atomic force electron microscope and by calculating the value described below.

According to the present invention, the recesses are formed by the removal of the crystal grains from the surface of the handle substrate. Intergranular boundaries are exposed between the exposed faces 2a of the crystal grains 2 exposed to the surface and forming the polycrystalline material, and the recesses 6 are formed along the intergranular boundaries. Therefore, the recesses 6 do not directly affect the microscopic center line average surface roughness Ra.

The diameters of the recesses 6 present on the surface of the handle substrate may preferably be distributed in a range of 10 µm or smaller, more preferably be in a range of 8 µm or smaller, in 95 percent or more of a number of the recesses. In the case that the diameter is distributed in a range exceeding 10 µm in 5 percent or more of a number of the recesses, the deterioration of the Ra value of the surface would become considerable to result in a cause of reduction of the bonding strength due to the intermolecular force.

However, the distribution of the diameters of the recesses on the bonding face of the handle substrate is measured by means of a laser microscope at a magnitude of 1000. Specifically, a diameter of a circle having the minimum area and capable of including the whole of the recess is defined as the diameter of the recess. The visual field to be measured is made 200 µm×200 µm, and the diameters of the recesses included in the visual field is measured and judged. In the case that a number of the recesses included in a single visual field is small, a plurality of the visual fields are observed so that total number of the recesses to be measured is 100 or larger.

Further, an average of the diameters of the recesses on the bonding face of the handle substrate may preferably be 5 µm or smaller and more preferably be 3 µm or smaller. Besides, the average of the diameters of the recesses on the bonding face of the handle substrate is obtained by measuring the distribution as described above and by calculating the average of the diameters.

As described above, by lowering the diameter of the recess on the bonding face of the handle substrate, it is possible to reduce the influences on the heat-dissipation property of the donor substrate and insulating property of the handle substrate.

Further, the diameters of the recesses on the bonding face of the handle substrate may preferably be distributed in a range of 0.5 µm or larger in 95 percent or more of a number of the recesses.

Further, the average of the diameters of the recesses on the bonding face of the handle substrate may preferably be 1.0 µm or larger and more preferably be 1.5 µm or larger.

As described above, by increasing the diameters of the recesses on the surface of the handle substrate, the effect of preventing the peeling due to the difference of thermal expansion as described above becomes more considerable. Further, in the case that the diameter of the recess is smaller than 0.5 µm, the inclusion of the adhesive layer into the recesses becomes difficult, so that it becomes difficult to expect the anchor effect.

On the viewpoint, the density of the recesses having diameters not lower than 0.5 µm may preferably be 50 counts or more, and more preferably be 200 counts or more, per an area of the surface of 1 $cm^2$, on the viewpoint of improving the adhesive force due to the anchor effect. Further, on the viewpoint of reducing the influences on the semiconductor, such as deterioration of thermal conduction, due to the presence of too many recesses, the density of the recesses having a diameter of 0.5 µm or larger may preferably be 4500 counts or less, and more preferably be 2000 counts or less, per an area of the surface of 1 $cm^2$.

Further, as to the depths of the recesses on the surface of the handle substrate, the depths may preferably be distributed in a range of 1 μm or less, and more preferably be 0.6 μm or less, in 95 percent of the whole number of the recesses. In the case that the depth is distributed in a range larger than 1 μm in 5 percent or more of the whole number of the recesses, the inclusion of the adhesive layer into the inside of the recess might become difficult, so that the thermal conductivity characteristic may be deteriorated.

Besides, the distribution of the depths of the recesses on the bonding face of the handle substrate is measured by means of an interferometer (produced by ZYGO corporation, Newview 7100, objective×50, zoom×1). Specifically, the maximum value of the depths of the observed recesses is defined as the depth of the recess. The visual field for the measurement was made 140 μm×110 μm, and the depths of the recesses included in the visual field were measured at the Rt values (measurement of PV value) and judged. In the case that a number of the recesses included in a single visual field is small, a plurality of the visual fields are observed so that a total number of the measured recesses is 100 or larger.

Further, the average value of the depths of the recesses on the bonding face of the handle substrate may preferably be 0.8 μm or smaller and more preferably be 0.5 μm or smaller.

As described above, it is possible to prevent the deterioration of the strength of the handle substrate due to concentration of stress around the recesses, by lowering the depth of the recess on the surface of the handle substrate.

Further, the depth of the recess on the surface of the handle substrate may preferably be 0.05 μm or larger in 95 percent or more of a number of the recesses.

Further, an average of the depths of the recesses on the bonding face of the handle substrate may preferably be 0.1 μm or larger and more preferably be 0.2 μm or larger.

As such, the effects of the present invention become more considerable by making the depth of the recess on the surface of the handle substrate larger.

The outline or shape of the recess on the bonding face of the handle substrate, viewed in a plan view, may preferably be that mainly composed of a curve than cornered shape. That is, the outline or shape of the recess on the bonding face of the handle substrate, viewed in a plan view, may preferably be composed of a smooth curve and preferably be free from corners.

Here, "smooth curve" is that defined mathematically. That is, a continuous curve may usually include a sharp point (cusp). "Smooth curve" refers to a continuous curve which does not include such sharp point and is differentiable over the whole length. In other words, "differentiable curve" or "smooth curve" refers to a continuous curve which is differentiable at an optional point on the continuous curve.

In the case that the outline of the recess includes a corner, cracks may easily occur due to the concentration of stress onto the corner, resulting in the deterioration of the strength of the substrate. In the case that the outline of the recess is composed of the smooth curve, such cracks can be prevented.

Such smooth curve may particularly preferably be a circle or ellipse for example.

Figure 5A:
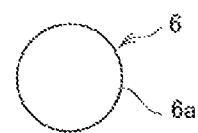
FIGS. 5(a), (b) and (c) are diagrams illustrating planar shapes of recesses, respectively.
Figure 5B:
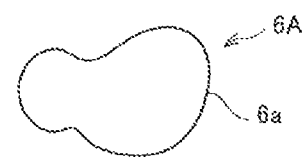

For example, according to an example of FIG. 5(a), the outline 6a of a recess 6 formed on the surface 15 has a shape of circle or ellipse. Further, according to an example of FIG. 5(b), the outline 6a of a recess 6A formed on the surface 15 is a smooth curve, although the shape is different.

Figure 5C:
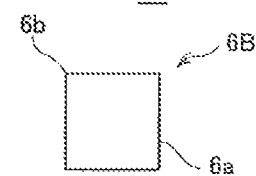

According to an example of FIG. 5(c), the outline 6a of a recess 6B formed on the surface 15 has a shape of a polygon, such as rectangle, having corners 6b.

The recess having the outline of smooth curve, as described above, can be obtained by subjecting the surface with the grains removed formed by lapping, to CMP process.

(Surface Treatment of Handle Substrate)

The surface of the inventive handle substrate can be obtained by subjecting a blank substrate 12 to polishing. Such polishing includes the following as an example.

First, a surface of the blank substrate is lapped using GC (green carbon) to form a ground treatment surface. It is then subjected to lapping using diamond abrasives having a large particle size. At this time, by performing an intermediate finishing using diamond abrasives having a particle size of 1 to 6 μm during the lapping with diamond, it is possible to form the recess as desired. The thus formed intermediate finished surface is subjected to finishing using colloidal silica or the like, so that it is possible to make the microscopic surface roughness to 5 nm or smaller and, at the same time, to effectively form the recesses on the surface.

(Embodiment of Bonding)

Further, as a technique used for the bonding, it may be used direct bonding through surface activation and substrate bonding technique using an adhesive layer, for example, although it is not particularly limited.

As the direct bonding, it may be appropriately used low-temperature bonding technique through surface activation. After the surface activation is performed in vacuum of about $10^{-6}$ Pa using Ar gas, a single crystalline material, such as Si, can be bonded to a polycrystalline material through an adhesive layer such as $SiO_2$ at ambient temperature.

As an example of the adhesive layer, $SiO_2$, $Al_2O_3$ and SiN are used in addition to the adhesion with a resin. In the case that the handle substrate is composed of high-purity alumina, a film of amorphous alumina is preferably used as the adhesive layer. That is, due to a difference of thermal expansion coefficients of the amorphous layer and polycrystalline layer, it is expected the improvement of adhesion strength due to the anchor effect by the amorphous film formed on the handle substrate. Further, as to the surface of the amorphous layer, it can be obtained a surface of Ra<1 nm or so by means of CMP process, so that it is expected the improvement of the adhesive strength due to intermolecular force with the substrate having high flatness. Such amorphous film can be formed by a known film-forming process such as vapor deposition, ion plating, CVD or the like.

EXAMPLES

It was produced a handle substrate 11 using translucent alumina ceramics, for conforming the effects of the present invention.

First, it was produced a blank substrate 12 made of translucent alumina ceramics.

Specifically, it was produced slurry by mixing the following ingredients.

(Powdery Raw Material)

α-alumina powder having a specific surface area of 3.5 to 4.5 $m^2$/g and an average primary particle size of 0.35 to 0.45 μm 100 weight parts

| | |
|---|---|
| MgO (magnesia) | 0.025 weight parts |
| $ZrO_2$ (zirconia) | 0.040 weight parts |
| $Y_2O_3$ (yttria) | 0.0015 weight parts |

(Dispersing Medium)

| | |
|---|---|
| Dimethyl glutarate | 27 weight parts |
| Ethylene glycol | 0.3 weight parts |

(Gelling Agent)

| MDI resin | 4 weight parts |
|---|---|

(Dispersing Agent)

| High molecular surfactant | 3 weight parts |
|---|---|

(Solvent)

| N,N-dimethylaminohexanol | 0.1 weight parts |
|---|---|

The slurry of the mixture described above was cast into a mold made of an aluminum alloy at room temperature and then maintained at room temperature for 1 hour. It was then maintained at 40° C. for 30 minutes for the solidification and then released from the mold. It was further maintained at room temperature and 90° C. for 2 hours, respectively, to obtain a plate-like powder molded body.

The thus obtained powder molded body was calcined (preliminary sintering) in air at 1100° C., then sintered in atmosphere of hydrogen 3: nitrogen 1 at 1700 to 1800° C., and then annealed under the same condition to produce the blank substrate 12 composed of a polycrystalline material. Further, in the case that considerable generation of bubbles is desired, the sintering temperature can be made 1500 to 1700° C. and the temperature can be rapidly elevated (1000° C./hour or faster) between 1400° C. to the sintering temperature, so as to reduce the removal of the bubbles to leave many bubbles inside of the blank material.

The thus produced blank substrate 12 was subjected to high-precision polishing. First, both faces were subjected to lapping using green carbon to adjust the shape, and the surface 12a was then subjected to single-face lapping using diamond slurry. By making the diamond particle size 3 μm, it becomes possible to easily form the fine crystal grains 4 and recesses 6. It was performed CMP polishing using colloidal silica, for obtaining the target surface roughness. It was thus obtained the handle substrate 11 having the surface morphology as shown in FIGS. 1(b) and 2.

As to the thus obtained handle substrate, it was measured a central line average surface roughness Ra of the surface of each crystal grain on the surface 15 in microscopic view to obtain a value lower than 1 nm. Besides, the measurement is performed as follows.

In the case that the surface roughness of each crystal grain is microscopically observed, it is applied observation of surface morphology in a visual field of 10 μm by means of AFM (Atomic force Microscope).

On the other hand, in the case that it is measured the surface roughness and morphology derived from the removal of grains and bubbles on the surface, it is applied measurement of Rt value (measurement of PV value) based on measurement of surface morphology in a wide visual field (in a visual field >70 μm) by means of AFM.

Further, as to the thus obtained handle substrate, it was measured a density of the recesses having a diameter of 0.5 μm or larger and present on the surface to obtain a value of 500 counts/cm². Besides, the measurement is performed as follows.

In the case that it is measured a density of the recesses present on the surface, it is used observation by means of a differential interference contrast microscope (magnitude of 500) and illumination onto the side face of the substrate by a fiber light. The observed visual field was made 500 μm×500 μm, the substrate plane was divided into 9 sites of 3×3 at a constant interval, and the observation was made in one visual field for each site to obtain results, whose average was calculated. The illumination onto the side face of the substrate by means of the fiber light is effective for emphasizing the fine recesses formed on the substrate surface.

Further, the density of the recesses on the substrate surface can be controlled by changing the particle size of the diamond slurry used in the intermediate finishing. For example, it was confirmed that the density of the recesses could be considerably increased as large as 1000 counts/cm² by making the particle size of the diamond slurry 1 μm.

Further, as to the thus obtained handle substrate, it was measured a depth of the recess present on the bonding face, so that a peak was observed at about 100 nm. Besides, it is used measurement of Rt value (measurement of PV value) by means of an interferometer (in visual field of 140 μm×110 μm) for the measurement.

FIG. 6 shows the distribution of the depth of the recess. As a result, the depth was distributed in a range of 0.05 μm or larger and 1.0 μm or smaller, in 95 percent of a number of the recesses. Further, the average of the recess was 0.3 μm.

Figure 7:
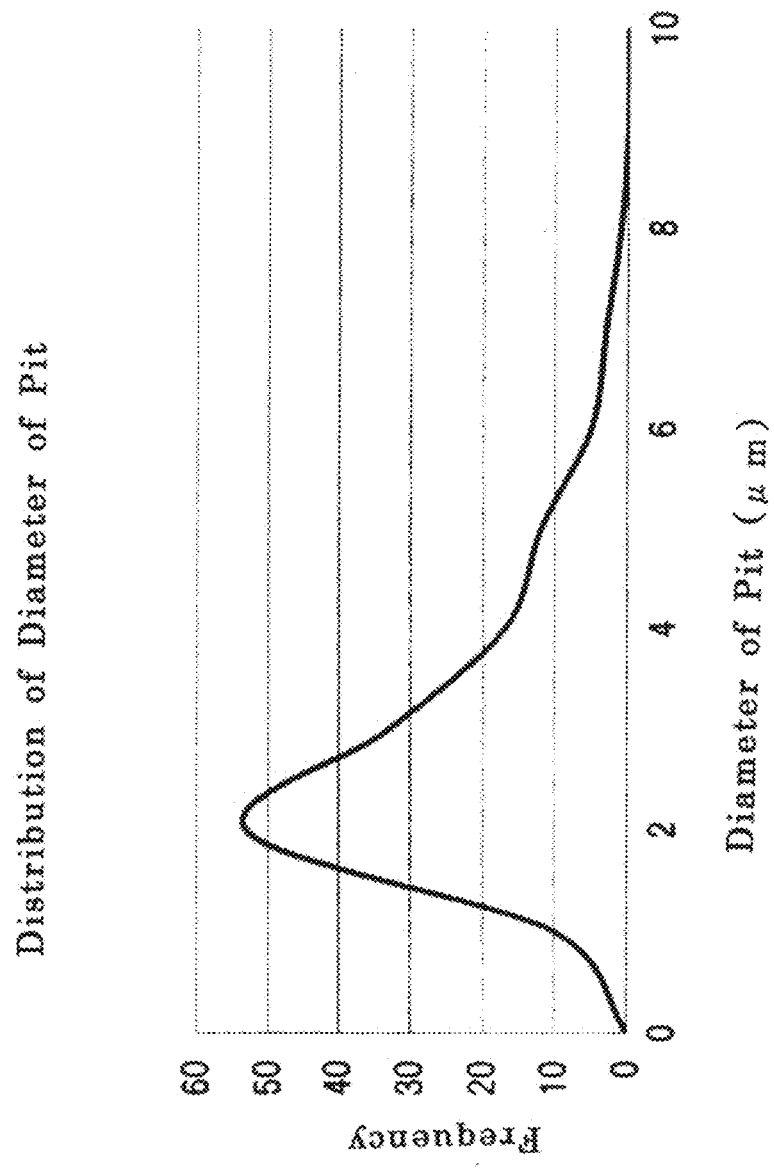
FIG. 7 is a graph showing distribution of sizes of recesses formed on a surface of a handle substrate.

Further, the outer outline of the recess was circle or ellipse. FIG. 7 shows the distribution of the diameter of the recess. As a result, the diameter was distributed in a range of 0.5 μm or larger and 10 μm or smaller in 95 percent of a number of the recesses. Further, the average of the diameter of the recess was 2.5 μm.

$SiO_2$ layer was formed on the surface of the thus obtained handle substrate as an adhesive layer to Si thin plate (donor substrate). Plasma CVD process was applied for forming the film and CMP polishing (chemical mechanical polishing) was performed after the film formation to make the film thickness of the finally obtained $SiO_2$ film 100 nm. Thereafter, plasma activation method was performed so that the Si thin plate (donor substrate) and $SiO_2$ layer were bonded with each other to produce a composite substrate composed of Si—$SiO_2$-handle substrate. Thereafter, the Si layer was thinned by polishing so that the thickness of the Si layer was made 500 nm.

The thus obtained composite substrate was heat treated at 1000° C. for 30 minutes, and it was thereby proved that the state of the bonding was not changed, cracks and peeling were hardly observed, and the anchor effect was sufficiently obtained due to the thus formed fine recesses.

Examples 2 to 10

It was produced the composite substrate 5 whose size, depth and density of the recess were adjusted and evaluated, similarly as the Example 1. The results were shown in tables 1 and 2.

Comparative Example

For comparing the adhesive strength of a substrate without the recesses, it was produced, as a handle substrate, a composite substrate having an Si substrate and LT (lithium tantalite) directly bonded thereto as a functional layer. The surface of the LT does not include physical steps and has Ra of 0.5 nm and PV value of 2 nm. The handle substrate was adhered onto a donor substrate composed of Si by direct bonding through surface activation method, and its film thickness was made 20 μm by polishing. The thus finished substrate was cut using a diamond blade so that it was partly observed peeling starting from the bonding interface. The ratio of occurrence of cracks or peeling was shown in table 2.

TABLE 1

| | Examples | | | | | |
|---|---|---|---|---|---|---|
| | 1 | 2 | 3 | 4 | 5 | 6 |
| Surface roughness of substrate (nm) | <1 | <1 | <1 | <1 | <1 | <1 |
| Average diameter of recess (um) | 2.5 | 1.5 | 1 | 3 | 5 | 2 |
| Average depth of Recess (um) | 0.3 | 0.2 | 0.1 | 0.5 | 0.8 | 0.25 |
| Density (counts/cm$^2$) | 500 | 1500 | 1500 | 500 | 300 | 2000 |
| Outline shape of Recess | Circle Ellipse | Circle Ellipse | Circle Ellipse | Circle Ellipse | Circle Ellipse | Circle Ellipse |
| Adhesive layer | SiO2 | SiO2 | SiO2 | SiO2 | SiO2 | Al2O3 |
| Ratio of occurrence of cracks or peeling | 5% | 7% | 9% | 7% | 9% | 2% |

TABLE 2

| | Examples | | | | Comparative Example |
|---|---|---|---|---|---|
| | 7 | 8 | 9 | 10 | |
| Surface roughness of Substrate (nm) | <1 | <1 | <1 | 5 | 0.5 |
| Average diameter of recess (um) | 2 | 2 | 2 | 4 | — |
| Average depth of recess (um) | 0.25 | 0.25 | 0.25 | 0.6 | — |
| Density (counts/cm$^2$) | 4500 | 50 | 200 | 1000 | — |
| Outline shape of recess | Circle Ellipse | Circle Ellipse | Circle Ellipse | Polygon | — |
| Adhesive Layer | Al2O3 | Al2O3 | Al2O3 | — | — |
| Ratio of occurrence of cracks or peeling | 5% | 5% | 2% | 12% | 26% |

The invention claimed is:

1. A handle substrate of a composite substrate for a semiconductor;
said handle substrate comprising an insulating polycrystalline material, wherein said handle substrate has a surface having a microscopic central line average surface roughness Ra of 5 nm or smaller; and
wherein recesses are formed on said surface and each recess has an outer profile of a circle or an ellipse in a plan view of said surface of said handle substrate.

2. The handle substrate of claim 1, wherein a density of said recess having a diameter of 0.5 µm or larger is 50 counts or larger and 4500 counts or smaller per 1 cm$^2$ of said surface.

3. The handle substrate of claim 1, wherein an average of a depth of said recess is 0.1 µm or larger and 0.8 µm or smaller.

4. The handle substrate of claim 1, wherein an average of a diameter of said recess is 1 µm or larger and 5 µm or smaller.

5. The handle substrate of claim 1, wherein said insulating polycrystalline material comprises alumina, silicon carbide, aluminum nitride or silicon nitride.

6. The handle substrate of claim 5, wherein said insulating polycrystalline material comprises a translucent alumina ceramics.

7. A composite substrate for a semiconductor, said composite substrate comprising said handle substrate of claim 1 and a donor substrate bonded to said surface of said handle substrate directly or through a bonding layer.

8. The composite substrate for a semiconductor of claim 7, wherein said bonding layer comprises $Al_2O_3$.

* * * * *